(12) United States Patent
Reinert

(10) Patent No.: US 7,781,331 B2
(45) Date of Patent: Aug. 24, 2010

(54) METHOD FOR PRODUCING ELECTRICALLY CONDUCTIVE BUSHINGS THROUGH NON-CONDUCTIVE OR SEMICONDUCTIVE SUBSTRATES

(75) Inventor: Wolfgang Reinert, Neumuenster (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 115 days.

(21) Appl. No.: 12/093,089

(22) PCT Filed: Nov. 8, 2006

(86) PCT No.: PCT/EP2006/068247

§ 371 (c)(1),
(2), (4) Date: May 8, 2008

(87) PCT Pub. No.: WO2007/054521

PCT Pub. Date: May 18, 2007

(65) Prior Publication Data

US 2008/0233740 A1    Sep. 25, 2008

(30) Foreign Application Priority Data

Nov. 9, 2005    (DE) .................. 10 2005 053 494

(51) Int. Cl.
*H01L 21/4763* (2006.01)
*H01L 21/44* (2006.01)
(52) U.S. Cl. .................. 438/637; 438/638; 438/640; 438/672; 438/675
(58) Field of Classification Search .................. 438/637, 438/638, 640, 672, 675
See application file for complete search history.

(56) References Cited

U.S. PATENT DOCUMENTS 4,097,890 A * 6/1978 Morris et al. ............... 257/621

(Continued)

FOREIGN PATENT DOCUMENTS

DE      102 44 077 A1     3/2004

(Continued)

OTHER PUBLICATIONS

Int'l Search Report, PCT/EP2006/068247, Feb. 2, 2007.

(Continued)

*Primary Examiner*—Luan C Thai
(74) *Attorney, Agent, or Firm*—Duane Morris LLP

(57) ABSTRACT

The present invention relates to a method for producing electrical bushings through non-conductive or semiconductive substrates, which are particularly suitable for electrical applications. The method is characterized in that a semiconductor substrate or a non-conductive substrate (13) whose front side has an electrically conductive contact point (6) at at least one location is provided with a recess (7) from its rear side such that the recess (1) on the front side of the substrate ends under that location or one of the locations at which the electrically conductive contact point or one of the electrically conductive contact points is situated and is completely covered by the latter, to which an electrically conductive structure (9) which establishes a conductive connection between the respective contact point and the rear-side surface (10, 11, 12) of the substrate through the recess or at least one of the recesses is applied from the rear side of the substrate. The invention also relates to substrates and components having a design that is predetermined by the method according to the invention.

33 Claims, 2 Drawing Sheets

U.S. PATENT DOCUMENTS

| | | | |
|---|---|---|---|
| 4,897,708 A | | 1/1990 | Clements |
| 5,910,687 A | * | 6/1999 | Chen et al. .................. 257/784 |
| 6,720,661 B2 | * | 4/2004 | Hanaoka et al. ............. 257/774 |
| 6,746,953 B2 | * | 6/2004 | Kramer et al. .............. 438/637 |
| 6,903,442 B2 | | 6/2005 | Wood et al. |
| 7,582,971 B2 | * | 9/2009 | Kameyama et al. ......... 257/774 |
| 2001/0028113 A1 | | 10/2001 | Kosaki et al. |
| 2004/0063268 A1 | | 4/2004 | Noma et al. |
| 2005/0167812 A1 | | 8/2005 | Yoshida et al. |
| 2005/0196957 A1 | | 9/2005 | Kameyama et al. |

FOREIGN PATENT DOCUMENTS

| | | |
|---|---|---|
| EP | 1 376 678 A2 | 1/2004 |
| EP | 1 564 805 A1 | 8/2005 |

OTHER PUBLICATIONS

Jean Gobet et al., "IC Compatible Fabrication of Through-Wafer Conductive Vias", SPIE, vol. 3223 (1997), pp. 17-25.

Stefan Linder, "Chip Stacks for Memory Applications"(Thesis), Swiss Federal Institute of Technology Zurich—DISS. ETH No. 11347, 1996, Switzerland.

* cited by examiner

State of the art

KEY:
Passivierung = Passivation
Metallisierung = Metallization

"METHOD FOR PRODUCING
ELECTRICALLY CONDUCTIVE BUSHINGS
THROUGH NON-CONDUCTIVE OR
SEMICONDUCTIVE SUBSTRATES

The present invention pertains to producing electrical bushings through non-conductive or semiconductive substrates, particularly for IC-compatible substrates, and thus producing substrates or electrical/electronic components that contain such bushings. Furthermore, the present invention pertains to the corresponding substrates and components themselves.

Most integrated circuits and MEMS [microelectromechanical systems—Tr.] components are still contacted by means of wire bonding technology. Some of these components have a more compact design and are contacted by means of flip chip technology for reasons of space. To this end, raised contact structures (so-called bumps) are applied to or in the vicinity of the bonding contact areas. The bumps usually consist of soft solder or gold, deposited on a basic metallization (UBM) [under bump metallization—Tr.]. There is a trend toward systems in a housing for products with a more highly integrated design of the next generations (SIP [system in a package—Tr.]; see FIG. 1, where an SIP is shown as CSP [chip scale package—Tr.] packaged for measuring rates of rotation, accelerations, etc., composed of a MEMS-CSP and a through-contacted ASIC [application specific integrated circuit—Tr.]). In order to guide the electrical contacts from plane to plane, direct through-contactings through the chips are the most compact even though presently not the cheapest method.

In their article "IC compatible fabrication of through-wafer conductive vias," *SPIE* Vol. 3223, pp. 17-25 (1997), J. Gobet et al. describe the production of conductive passages, so-called vias, through a silicon wafer. The substrate, protected by a negative photoresist, is etched on the uncoated points by means of a plasma etching method until a passage through the substrate is formed. This [the said passage] is insulated by means of a parylene layer and is then lined with metal by means of a sputter technique. At the same time, conductive structures are produced on both sides of the substrate with this method.

However, in the authors' opinion, the metallization step is particularly critical, since a sufficient deposition of the metal on the inside on the vertically running via walls can hardly be achieved. The more unfavorable the ratio of the diameter of the substrate to the diameter of the via is, the more difficult this problem is. Moreover, the open perforations make it necessary to select such a method strategy for the metallization, in which both sides of the substrate are coated with metal.

An alternative strategy is critically discussed in US Patent Application 2001/28113 A1. Reference is made there to older state of the art, according to which the contacting of a conductive structure of the front side is carried out while producing a rear-side recess, which is formed by means of wet etching, has a dome shape and is metallized by means of electrolytic or non-electrolytic nickel plating in a later step. The recess has a base width that corresponds at least to twice the thickness of the substrate, in order to make possible the deposition of nickel in the otherwise too narrow recess. However, this is considered to be a drawback.

The object of the present invention is to eliminate the above-mentioned drawbacks and to provide a method for producing bushings through a non-conductive or semiconductive substrate that can be carried out with relatively few steps and is thus cost-effective.

This object is accomplished by a method for producing electrically conductive bushings through a semiconductive or non-conductive substrate that is particularly suitable for electrical applications, comprising the steps:
  (a) providing a semiconductive or non-conductive substrate, whose front side has an electrically conductive contact point at least one location,
  (b) forming at least one recess in the substrate from its rear side, such that the recess on the front side of the substrate ends under that location or one of the locations at which the electrically conductive contact point or one of the electrically conductive contact points is situated and is completely covered by the latter,
  (c) applying from the rear side of the substrate an electrically conductive structure, which establishes a conductive connection between the respective contact point and the rear-side surface of the substrate through the recess or at least one of the recesses.

The present invention is explained in the attached drawings, in which.

Figure 1:
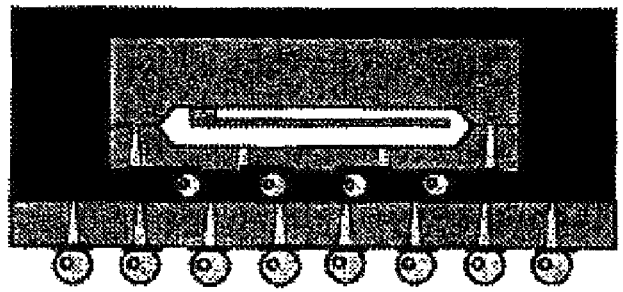
FIG. 1 depicts an SIP shown as CSP packaged for measuring rates of rotation, accelerations, etc., composed of a MEMS CSP and a through contacted ASIC.
Figure 2:
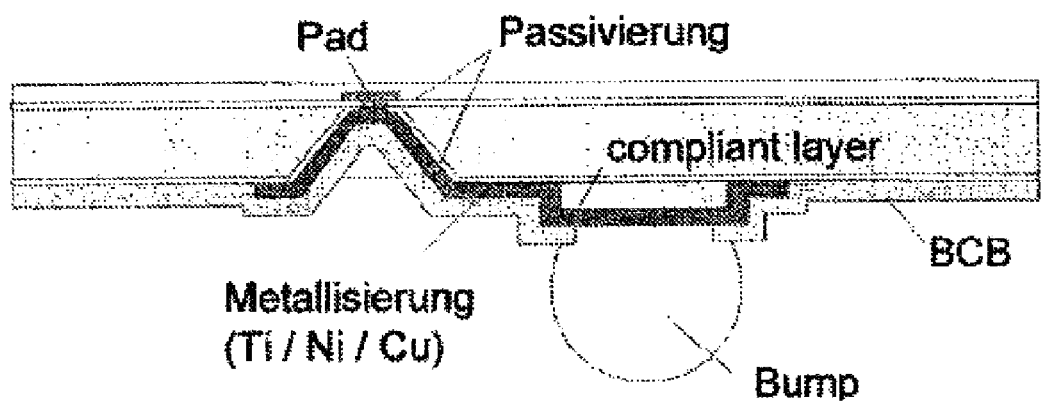
FIG. 2 depicts the through-contacting using the example of an image sensor.

Both stacked chip structures, such as are required, e.g., as MEMS-CSP, Opto-CSP or the like for measuring rates of rotation, accelerations, etc., and single components, such as CCD [charge-coupled device—Tr.], CMOS [complimentary metal-oxide semiconductor—Tr.] or BICMOS [bipolar complimentary metal-oxide semiconductor—Tr.] image sensors (camera chips) can be produced with the method according to the present invention. MEMS-CSP and Opto-CSP with vertical electrical bushings can be assembled very simply, but highly accurately via SMT [surface mount technology—Tr.] assemblers and make possible the production of the smallest components at low costs. FIG. 2 shows the through-contacting using the example of an image sensor.

Semiconductors, such as silicon wafers, but also other non-conductive substrate materials such as GaAs, glass, Pyrex and ceramics are possible as substrate materials; the method is not limited in this regard as far as the principle is concerned.

The technology employed according to the present invention uses, if possible, a method sequence and method parameters that do not change preprocessed components (e.g., on wafer plane) in their functional properties. In particular, all steps can be carried out at temperatures below 400° C., and especially preferably even below 200° C., which makes a use of the method suitable even for the production of color camera image sensors. If the method according to the present invention is aimed at producing integrated circuitry systems, light IC-compatible aids and materials can be used for this. Special processes in lithography are avoided in that open perforations in the semiconductor substrate are not present at any time.

The method can be applied both to uncoated substrates and substrates, whose surfaces are covered on one or both sides with a coating, for example, a passivation. An example of this is a silicon wafer that is covered with a thin layer of $SiO_2$.

Step (b) of the method, forming at least one recess in the substrate from its rear side, is preferably carried out by means of an etching method. In this case, recesses are etched into the substrate via a mask produced by lithography on the substrate rear side. The mask can be placed onto the substrate so that it can be later detached or otherwise removed again; it may, however, also consist of a material that adheres to the substrate, e.g., a lacquer or aluminum layer or an $SiO_2$ layer ("hard mask") that is resistant to the etching medium. This [layer] may, but does not have to, remain on the substrate even subsequently. The etching may be a plasma etching method using a suitable gas mixture. This [gas mixture] may contain, e.g., an oxidizing sulfur hexafluoride, if the substrate is a silicon wafer. Silicon can be treated particularly by means of the so-called high-rate etching (Deep Reactive Ion Etching, DRIE). Such etching methods attack silicon, but not $SiO_2$, aluminum or lacquer. As an alternative, the recess can be produced mechanically, e.g., by means of sputtering UV laser radiation.

The recesses obtained according to step (b) may have any diameter. A diameter of about 10 μm to 250 μm, and preferably 20 μm to 100 μm, is frequently desired, with a thickness of the substrate of preferably 35 μm to 500 μm.

In a particularly favorable embodiment of the present invention, the recesses receive a cone-like shape, in which the cross section of the recesses becomes smaller in the direction of the front side of the substrate. The sides of this recess are considerably more easily accessible during later coating processes and make possible a more uniform coating of material as a via-like bushing with diameter remaining the same. They preferably have a side angle of about 90°-70°, preferably about 85°-75° and very especially preferably of about 80°. The recesses may, but do not have to, be uniform or symmetrical. The cone-like shape of the recesses may extend beyond the total thickness of the substrate; however, instead of this, one may also work with a so-called "under-etching," in which the hole diameter widens to its maximum diameter first shortly behind the rear-side outer surface and then narrows in a cone-shaped manner.

A side structure can be achieved, for example, by means of etching according to the Bosch method (alternately using etching gas, e.g., $SF_6$, and a gas, which can provide for a passivation by means of plasma polymerization, e.g., $C_4F_8$) or by means of a dry etching process with $SF_6/O_2$ as mixing gas, whereby $SiO_2$ forms as inorganic side wall passivation.

In the conventional Bosch process, ions and radicals form in the process gas. The ions are guided via a prestress directed on the wafer, remove the passivation layer at the base of the hole due to their sputtering action upon impact and react there with silicon to become gaseous SiF. Correspondingly, very few ions impact the side walls. If now the prestress is switched off and etching is carried out primarily with the neutral particles in the already exposed area, whereby optionally the percentage of neutral particles is increased by increasing the working gas pressure, the formation of the side wall passivation can be influenced. This may additionally happen through the duration of the passivation. A non-closed side wall passivation is attackable for the neutral particles, so that an etching action directed outwardly forms. Thus, the formation of a hole angle can be determined by controlling the ratio of directed ionic etching (by different prestress) to the side wall passivation with identical working gas pressure.

The conditions of the etching method are selected, so that the electrically conductive contact point situated on the front side of the substrate is exposed from the rear side, but is not attacked. If the contact point is exposed, the etching process is stopped due to its very low sputtering rate on this material. The contact point covers the formed recess towards the front side, so that the substrate remains gas-tight.

The contact points themselves are formed in accordance with the needs of the later component. They will usually consist of a suitable metal that was, e.g., sputtered or vacuum evaporated. These may, but do not have to, be wire bonding areas. An especially preferred variant of the embodiment of contact points is described further below.

In specific cases the conductive structure according to step (c) can be subsequently applied directly to the substrate[.] This may be favorable, e.g., for semiconductive chips, which are provided for special cases, such as high-performance boosters for mobile phones. Better adaptation of potential to earth and at the same time a better de-warming of the chip can consequently be achieved. Of course, this method sequence is also suitable in all those cases, in which the substrate is non-conductive.

The conductive structure according to step (c) can be applied by means of current techniques, e.g., physical sputtering, vacuum evaporating, electroplating or currentless deposition from solutions. It may have one or more layers. Suitable materials for this are, e.g., metals, such as titanium, chromium, tungsten, TiN, aluminum, nickel, gold, silver or copper or alloys containing these metals. Suitable multi-layer metallizations are, e.g., Ti/Ni/Ag, TiW/gold, Cr/Cu/Au, Al/NiV/Cu or Ti/TiN/Cu. If a continuous layer is produced, it can be subsequently structured by means of such common methods as preferably spin or dry resist lithography and wet etching, but also by means of dry etching or lift-off technology. In this case, both the metallization around the bushings and strip conductors and soldering contact areas can be structured at the same time. The soldering areas can be arranged in structured form removed from the bushings or else be superimposed with the bushings. In this case, contact materials are applied directly to the bushing.

As an alternative, the conductive structure can, of course, be applied directly in structured form by using a mask.

In those cases, in which the substrate should be insulated against the electrically conductive bushing or in which this is desired, a passivation layer is arranged on the substrate before the application of the conductive structure according to step (c). If the substrate consists of silicon, this can consist, for example, of silicon dioxide, silicon nitride or a silicon oxide nitride. The advantage of such passivations is their high temperature resistance. As an alternative, an insulating polymer, and in particular an organic or inorganic-organic polymer, can be applied in all cases regardless of the material of the substrate. Materials that are relatively largely temperature-resistant are favorable for this as well. Therefore, inorganic materials, but also, e.g., organic polymers such as parylene which is stable up to about 290° C. are likewise considered for this. The passivation layer can be applied in any thickness; e.g., 0.4-2 μm are favorable.

The passivation layer can be applied in any manner. Low-temperature plasma or plasma-supported methods are also favorable for this, e.g., if the layer consists of parylene or SiN.

Preferably, the passivation not only covers the recesses in the substrate, but also desired parts or even the entire rear side of the substrate. As an alternative, it can be applied in a structured manner.

If the passivation layer is applied such that it also covers the rear sides of the contact points situated on the front side, these must be exposed again before applying the conductive layer according to step (c). This may take place by means of a gas-phase etching process. If the metal of the contact point was oxidized during the passivation or was oxidized for other reasons, it can be de-oxidized again, e.g., by means of argon ionic bombardment. The subsequently deposited metal layer thus has a low transfer resistance and a high current-carrying capacity.

After the production of the bushings according to step (c), the rear side of the substrate can be partly or completely covered, as needed, with a passivation layer up to locations (soldering areas) and/or saw streets provided for later contactings. This layer preferably consists of benzocyclobutene (BCB) or polyimide (PI). Other organic polymers, but also inorganic-organic or purely inorganic materials, such as $SiO_2$ are additionally possible. The passivation layer can be subsequently structured, e.g., by lithography, or else also be applied in a structured manner, e.g., via a mask or in a structured printing process.

Optionally, solder globules are subsequently applied from a defined solder alloy. This can happen via a solder paste printing process with subsequent remelting and cleaning or by depositing preformed solder globules and remelting or by means of a galvanic deposition of solder material onto the exposed soldering contact areas. Optionally, instead of a soft solder, an alternative contact material, such as palladium, nickel, gold, copper or the like can be applied, and preferably by means of galvanic deposition.

Further above, it was already mentioned that as a substrate material for the present invention may be one that can be covered on one or even on both sides with a coating, for example, a passivation.

Since this layer on the front side might possibly represent a barrier for the gradual etching from the rear side, such as would be the case, e.g., in the above case of a silicon wafer covered with $SiO_2$, the electrically conductive contact point is arranged optionally offset at the top on, but preferably in or under the said layer, in such, optionally but also other substantiated cases. In such cases, the front side of the substrate can be structured beforehand, e.g., by etching this layer at the desired contact points and by applying the electrically conductive contact material at this point.

An especially preferred embodiment of the present invention, which is particularly suitable for the contacting of preprocessed semiconductive substrates, therefore provides, for such cases as well as for cases, in which the contact point on the front side of the substrate can or shall not be contacted directly from the rear side for other reasons, the additional formation of a contact hole in the form of a recess in the layered structure of the front side, such that the recess preferably reaches up to the semiconductive substrate. If necessary, this recess is then provided with a passivation layer, before finally a metallization layer is deposited and structured therein, such that the metallization layer connects the base of the formed recess to the electrically conductive contact point in an electrically conductive manner.

Of course, in such cases, a point without active electronic components must be provided already in the design in the vicinity of the front-side contact points. In order to form the recess, the front side is covered with a mask, e.g., by applying and structuring a photosensitive resist. For the etching of the recess, various methods known in semiconductor production, optionally also in combination, can be used depending on the layered structure and passivation materials used. Besides dry etching with fluorine-containing gas mixtures, a wet structuring with HF-containing acids is possible. Besides, those methods that are indicated for the rear side recess may, of course, also be used for the formation of the front-side recess.

The shape of the recess may be selected randomly. In a preferred embodiment of the present invention, it has, like the rear-side recess of the present invention, a side angle of about 90°-70°, preferably 85°-75° and very especially preferably about 80°. The recesses may, but do not have to, be uniform or symmetrical. The cone-like shape of the recesses may extend over the entire thickness of the substrate; instead of this, however, one may also work with a so-called "under-etching," in which the hole diameter widens to its maximum diameter first shortly behind the rear-side outer surface and then narrows in a cone-shaped manner. However, it is equally preferred if the recess has vertical side walls.

After that, the lacquer is removed, and depending on the layered structure and substrate material, a passivation layer is optionally applied, e.g., preferably consisting of $SiO_2$, if the substrate is a silicon material. This may subsequently be structured via lithography and a dry etching process, such that both the front-side contact point and a contact window in the recess are open. This lacquer is also subsequently removed again. Then at least one metal layer or a composite of metal layers is applied to the wafer front side. For example, an aluminum alloy, such as $AlSi_1$, $AlSi_1Cu_{0.5}$ is suitable as the metal layer. As the composite of layers, it is possible to use one consisting of at least two, but possible also three or even more layers, selected from among adhesion promoter and/or diffusion barrier layers and a readily electrically conductive cover layer. Examples of layered composites are Ti/TiN/Cu, TiW/Ni/Au [sic—erroneous comma in original text—Tr.] or Ti/Pt/Au. These layers may be applied either sputtered (e.g., by means of PVD) or vacuum evaporated or via chemical vapor deposition (CVD). Other method variants, as known to the person skilled in the art, are also possible. In a further process step, this full-area metal layer must be subsequently structured, for example, by means of a lithographic method. To this end, dry etching processes can optionally be used depending on the layer system; however, usually [sic, obvious typo in original—Tr.] wet etching processes are used, with high-grade cover layers also in different etching liquors one after the other. The lithography mask, usually a lacquer, is subsequently removed again. The structuring takes place such that consequently a more or less short or direct electrical connection is present between the front-side contact point and the new recess made in the front-side substrate structure. The recess is preferably metallized towards the upper edge in a somewhat overlapping manner; however, at least one strip conductor is present that completely covers the contact window situated at the base of the recess. Optionally, an additional passivation layer, for example, consisting of $SiO_2$ or SiN, can be applied partly or completely to the front surface of the substrate structure using one of the methods described.

It is preferred that the said additional formation of a contact hole in the form of a recess in the layer structure of the front side take place before the formation of the rear-side recess. In these cases, the rear-side recess is applied subsequently, so that it ends in the direction of the front side of the substrate under the metal layer that was inserted into the front-side recess. As a result, at any time during the method, the substrate remains continuous and thus gas-impermeable, so that it is able to function as a seal for the opposite side or surface. If a passivation layer lies under this metal layer, which is optionally possible as described above, this [passivation layer] must leave the contact window untouched from the start or else be subsequently removed from the rear side together with the substrate.

As an alternative, the respective recesses are formed in the reverse sequence. Of course, then, the reverse is true, that the recess from the front side must pass through a possibly present passivation layer of the rear-side recess.

A significant reduction in the operating voltage is avoided due to the contact guiding at the surface, e.g., of original wire bonding pads explained above.

The above process steps for forming a front-side contact hole and its contacting at adjacent original contact points (designated below as "indirect front-side contacting") are preferably carried out in combination with the above-described rear-side contacting according to the present invention. It should, however, be clear that it can also be used as an independent method if the said rear-side contacting shall not or cannot be carried out or not in the manner described above. For example, the indirect front-side contacting in combination with rear-side contactings is possible, as they are already known from the state of the art. Consequently, it should be clear that the present application contains two different embodiments of the invention disclosed therein, which can be used optionally separately, but preferably in combination with one another. Accordingly, it is to be understood from FIG. 3 that the front-side and rear-side structures according to the present invention shown can be present either in combination or only individually, respectively.

Figure 3:
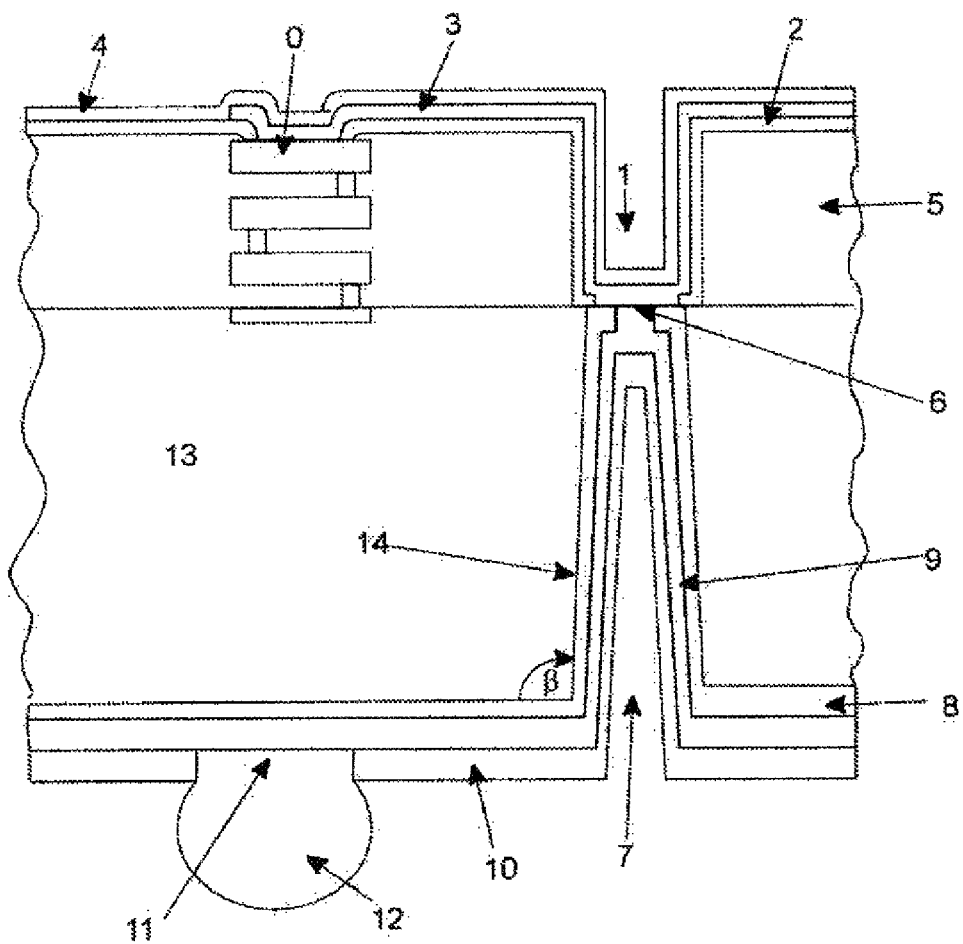
FIG. 3 shows a substrate with front-side-applied IC processing.

The structure that can be obtained with the two methods according to the present invention may now be described based on FIG. 3, which shows, as an example, a substrate with front-side-applied IC processing.

A preprocessed semiconductive substrate 13 with original contact points 0, in which they may be, for example, wire bonding areas, is shown. The recessed front-side contact is shown at 1, which can be formed by means of the method described above. An—optionally present—passivation layer 2 lines the sides of the recess or of the contact hole 1 and, moreover, covers the remaining layer structure 5 of the IC processing with the exception of the contact points 0, but is not present in the contact area of the rear-side contacting. A possibly present adhesion promoter or such a diffusion barrier layer above the passivation layer are [sic, is—Tr.] not shown; therefore, the metallization layer 3, covered by a passivation layer 4, is situated above the passivation layer. The metallization 3 connects the contact points 0 to the contact window 6 between the front-side and rear-side contact[s]. The rear-side recess has a slightly conical design; its sides 14 have a side angle of $180°-\beta$. Like the front-side recess 1, it is lined with a passivation layer 8, which, however, leaves the contact window untouched. Situated thereon are a metallization layer 9 and a passivation layer 10. Above the metallization [sic, layer?—Tr.] 9 there is contact with a solderable contact area 11 and a soldering contact 12. It should be clear that the rear-side recess may also have additional layers, as is explained in detail above for the front-side recess and furthermore in the description of the method.

The invention claimed is:

1. Method for producing an electronic component comprising at least one electrically conductive bushing through a semiconductive or non-conductive substrate thereof, which is particularly suitable for electric applications, wherein a front side of the substrate is provided with one or more layers as well as with at least one electrically conducting contact structure within or on said layers, comprising:
   (a) providing said semiconductive or non-conductive substrate;
   (b) forming at least one recess in the substrate, starting from the said front side that extends through said layers, beside at least one conducting contact structure;
   (c) applying an electrically conductive structure which extends, at least starting from said conductive contact structure, down to the base of the recess, such that it forms an electrically conductive contact point;
   (d) forming at least one recess in the substrate from its rear side, such that said recess ends below that location or below one of the locations where the electrically conductive contact point or one of the said electrically conductive contact points is situated on the front side of the substrate, and is completely covered by the latter; and
   (e) applying from the rear side of the substrate an electrically conductive structure, which establishes a conductive connection between said respective contact point and said rear-side surface of the substrate through said recess or at least one of the recesses, wherein the conductive connection will serve as a conductive bushing of the finalized electronic component.

2. Method in accordance with claim 1, characterized in that said conductive contact structure is buried in said layer or one of said layers which are provided on the front side of the substrate.

3. Method in accordance with claim 1, wherein said rear-side or front-side recesses in the substrate have an essentially cone-shaped design.

4. Method in accordance with claim 1, wherein said rear-side recesses in the substrate are formed by etching of the rear side of the substrate, whereby the etching lasts until the etching process has at least partly exposed the area of said conductive contact points, and is interrupted in a timely manner, such that said area still covers the recesses in the substrate formed by the etching in a sealing manner.

5. Method in accordance with claim 4, wherein the technique used for etching is selected from among (a) plasma etching, (b) wet etching, and (c) etching by means of UV laser beam.

6. Method in accordance with claim 1, wherein said electrically conductive structure on the rear side of the substrate or said electrically conductive structure on the front side of the substrate is applied in the form of a continuous layer, which is subsequently structured.

7. Method in accordance with claim 1, wherein said electrically conductive structure on the rear side of the substrate or said electrically conductive structure on the front side of the substrate are applied by means of lithographic methods or printing methods.

8. Method in accordance with claim 1, characterized in that, before step (e), a passivation layer is deposited at least on the side walls of the recesses formed in step (d) and, if desired, also on the rear side of the substrate, or that, before step (e), a passivation layer is deposited at least on the side walls of the recesses formed in step (b).

9. Method in accordance with claim 8, wherein said contact point on its front side or rear side is further covered with said passivation layer, and this is subsequently at least partly removed by means of a suitable method, before the conductive structure is produced according to steps (c) or (e).

10. Method in accordance with claim 9, wherein said passivation layer is applied by oxidation or nitration of the substrate material by means of sputter technology or plasma-supported CVD, or is produced by applying an organic or inorganic-organic polymer material.

11. Method in accordance with claim 1, characterized in that the rear side of the substrate or the upper side of said layers on the front side of the substrate is covered with a structured passivation layer, after step (e), wherein those locations of the conductive structure which are to be subsequently used as electrical contact points or saw streets, remain free of said passivation layer.

12. Method in accordance with claim 1, wherein a contact material or a soldering material is applied to those locations of the conductive structure that are to be provided as rear-side electrical contact points.

13. Method in accordance with claim 12, wherein the contact material consists of a conductive metal.

14. Electronic component comprising a non-conductive or semiconductive substrate provided with at least one electrical bushing, wherein the bushing has been realized in that said substrate on its front side at least one location has an electrically conductive contact point, which is connected to an electrically conductive structure which extends through a recess in the substrate and down to its rear-side area, wherein the recess toward the front side of the substrate is completely covered by the first electrically conductive structure, and wherein the front side of said substrate is provided with one or more layers as well as with at least one conductive contact structure within or on these layers and said contact point is situated at the base of a recess in the substrate which, starting from the surface, extends through said one or more layers, whereby said electrically conductive contact structure and the recess are at a distance from one another and are connected to one another by means of an electrically conductive layer.

15. Electronic component comprising the substrate in accordance with claim 14, wherein the substrate is a silicon wafer.

16. Electronic component comprising the substrate in accordance with claim 14, wherein at least the sides of at least one of said recesses are covered by a passivation layer which insulates the second electrically conductive structure from the substrate.

17. Electronic component comprising the substrate in accordance with claim 14, wherein the rear side of the substrate is covered with a passivation layer or the surface of said front-side layers is covered with a passivation layer which leaves open only those locations of the electrically conductive structure that are provided as electrical contact points.

18. Electronic component comprising the substrate in accordance with claim 14, wherein a contact material is present on those locations of the electrically conductive structure that are provided as said electrical contact points.

19. Electronic component comprising the substrate in accordance with claim 18, wherein at least one of said electrical contact points is situated at least partly above that recess via which it is connected to the first electrically conductive structure.

20. Electronic component comprising the substrate in accordance with claim 18, wherein at least one of said electrical contact points is situated at a distance from that recess via which it is connected to the first electrically conductive structure.

21. Electronic component comprising the substrate, obtained according to the method in accordance with claim 1.

22. Method according to claim 1, wherein each rear-side recess has a cross-sectional area which becomes smaller in the direction of the front side of the substrate, or wherein each front-side recess has a cross-sectional area which becomes smaller in the direction of the contact point, and wherein the rear-side or front-side recesses have a side angle of 70-90°.

23. Method according to claim 22, wherein the sides of the recesses have an angle of 75-85°.

24. Method according to claim 23, wherein the sides of the recesses have an angle of about 80°.

25. Method according to claim 5, wherein plasma etching is selected from sulfur (VI) fluoride, in case the substrate is a silicon wafer, high-rate etching and "Deep Reactive Ion Etching" (DRIE), and wherein wet etching is selected from among etching with an HF-containing acid or KOH etching, using a suitable mask in each case.

26. Method according to claim 7, wherein said electrically conductive structure is applied by means of lithographic methods, printing methods or etching methods.

27. Method according to claim 13, wherein the conductive metal is selected from palladium, nickel, copper and gold.

28. Method according to claim 27, wherein the metal is applied by means of galvanic deposition.

29. Electronic component comprising the substrate according to claim 18, wherein the contact material is selected from palladium, nickel, gold and copper.

30. Electronic component comprising the substrate according to claim 14, wherein a soldering material is present on those locations of the electrically conductive structure that are provided as electrical contact points.

31. Electronic component comprising the substrate according to claim 30, wherein the soldering material is in the form of remelted solder globules.

32. Electronic component comprising the substrate according to claim 14, wherein the electrically conducting structure which extends through a recess in the substrate and down to its rear-side area is a metallization layer.

33. Method according to claim 1, wherein the electrically conductive structure which is applied according to step (c) is a metallization layer.

* * * * *